(12) United States Patent
Wang et al.

(10) Patent No.: US 8,384,195 B2
(45) Date of Patent: Feb. 26, 2013

(54) NANOCHANNEL DEVICE AND METHOD FOR MANUFACTURING THEREOF

(75) Inventors: Gang Wang, Leuven (BE); Joshua Tseng, Tervuren (BE); Roger Loo, Kessel-lo (BE)

(73) Assignees: IMEC, Leuven (BE); Taiwan Semiconductor Manufacturing Company, Ltd., Hsinchu (TW); Katholieke Universiteit Leuven, K.U. Leuven R&D, Leuven (BE)

( * ) Notice: Subject to any disclaimer, the term of this patent is extended or adjusted under 35 U.S.C. 154(b) by 72 days.

(21) Appl. No.: 13/100,537

(22) Filed: May 4, 2011

(65) Prior Publication Data
US 2011/0272789 A1 Nov. 10, 2011

Related U.S. Application Data

(60) Provisional application No. 61/331,212, filed on May 4, 2010.

(51) Int. Cl.
*H01L 29/06* (2006.01)
(52) U.S. Cl. ............... 257/618; 257/E29.003; 438/478
(58) Field of Classification Search ............ 438/478; 977/814
See application file for complete search history.

(56) References Cited

U.S. PATENT DOCUMENTS

| 4,210,470 | A | * | 7/1980 | Marinace | 148/33.2 |
| 4,522,662 | A | * | 6/1985 | Bradbury et al. | 117/90 |
| 6,495,294 | B1 | * | 12/2002 | Yamauchi et al. | 438/597 |
| 2007/0148931 | A1 | * | 6/2007 | Tokano et al. | 438/561 |

FOREIGN PATENT DOCUMENTS
WO WO2007/139511 12/2007

OTHER PUBLICATIONS

Cao, Han et al., "Fabrication of 10 nm Enclosed Nanofluidic Channels", Applied Physics Letters, vol. 81, No. 1, Jul. 1, 2002, pp. 174-176.
Wong, Chee Chung et al., "Fabrication of Self-Sealed Circular Nano/Microfluidic Channels in Glass Substrates", Nanotechnology, vol. 18, 2007, pp. 1-6.
Chen, Xin et al., "Aligned Horizontal Silica Nanochannels by Oxidative Self-Sealing of Patterned Silicon Wafers", Chem. Mater., vol. 19, 2007, pp. 3-5.
Chen, Xin et al., "Aligned Horizontal Silica Nanochannels by Oxidative Self-Sealing of Patterned Silicon Wafers", Max Planck Institute of Microstructure Physics, Weinberg, Germany, pp. 1-6.

* cited by examiner

*Primary Examiner* — Steven Loke
*Assistant Examiner* — Sitaramarao S Yechuri
(74) *Attorney, Agent, or Firm* — McDonnell Boehnen Hulbert & Berghoff LLP

(57) ABSTRACT

The present disclosure relates to a device comprising a mono-crystalline substrate, the mono-crystalline substrate having at least one recessed region which exposes predetermined crystallographic planes of the mono-crystalline substrate, the at least one recessed region further having a recess width and comprising a filling material and an embedded nanochannel, wherein the width, the shape, and the depth of the embedded nanochannel is determined by the recess width of the at least one recessed region and by the growth rate of the growth front of the filling material in a direction perpendicular to the exposed predetermined crystallographic planes. The present disclosure is also related to a method for manufacturing a nanochannel device.

11 Claims, 3 Drawing Sheets

A
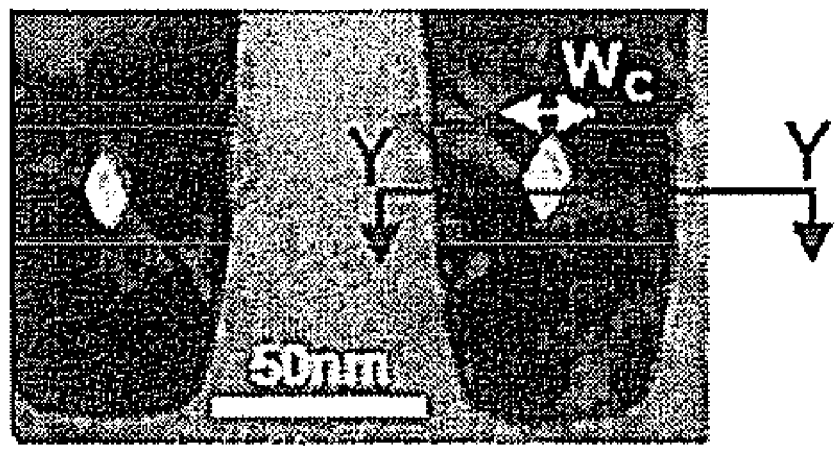
B
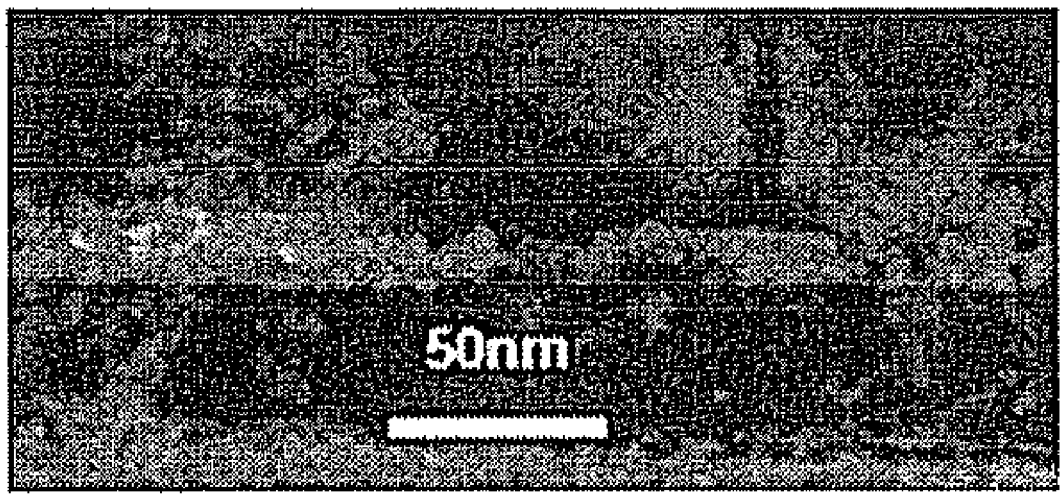
FIGURE 1 A, B

NANOCHANNEL DEVICE AND METHOD FOR MANUFACTURING THEREOF

BACKGROUND OF THE INVENTION

1. Field of the Invention

The present invention relates generally to a nanochannel device, and particularly to a nanochannel device comprising a nanochannel or array of nanochannels with controlled nanochannel size, width, and length. The present invention further relates to a method for manufacturing said nanochannel device. The method can, for example, be used or integrated in high throughput and low cost manufacturing such as the ultra-large scale integration semiconductor manufacturing.

2. Background of the Invention

Manipulating matter at the nanometer scale is important for many electronic, chemical and biological advanced applications, but present solid-state fabrication methods do not reproducibly achieve dimensional control at the nanometer scale.

For example, nanochannels or nanopores with pore width or channel width of less than 10 nm are of great interest in single molecule or DNA separation and detection.

High throughput, low cost and precise diameter and length control are needed in bioMEMS, biochips and biosensors. In addition, easy integration approach for nanochannel fabrication with device processing is required.

Conventional approaches for forming nanochannels are e-beam lithography and ion-beam sculpting, both known to be expensive and highly complex.

Alternatively, a sequence of oxidation and CMP is a well established technique, with a high process complexity, capable to fabricate pores with large diameter.

Depositing a non-conformal PECVD film is also a well established process suitable for forming pores having a large diameter, but having unfortunately process control issues and requiring thermal treatments upon deposition.

These conventional approaches are either expensive or they show poor control over the size, such as width and length, and uniformity of nanochannel. Some conventional fabrication approaches are not integration friendly, either.

AIMS OF THE INVENTION

It is an aim of the present invention to provide a nanochannel device comprising an embedded nanochannel or nanopore having a channel or pore width smaller than 1 micron, preferably smaller than 10 nm, and a channel or pore length in the microns range or longer.

More particularly, it is an aim of the present invention to provide a nanochannel device comprising an embedded nanochannel or nanopore having a substantially uniform width over the whole length of said nanochannel.

Furthermore, the present invention is aimed at providing a nanochannel device comprising an array of nanochannels having a regular distribution of nanochannels, each of the nanochannels having a width smaller than 1 micron, preferably smaller than 10 nm, a channel or pore length in the microns range or longer, and having a substantially uniform width over the whole length of each of said nanochannels.

Yet another aim of the present invention is to provide a method for manufacturing said nanochannel device comprising an embedded nanochannel or array of nanochannels.

SUMMARY OF THE INVENTION

It is against the above background that the present invention provides certain advantages and advancements over the prior art.

Although this invention is not limited to specific advantages or functionality, it is noted that the invention provides a device comprising a mono-crystalline substrate the monocrystalline substrate having at least one recessed region which exposes predetermined crystallographic planes of the monocrystalline substrate, the at least one recessed region further having a recess width and comprising a filling material and an embedded nanochannel, wherein a width, a shape and a depth of the embedded nanochannel is determined by the recess width of the at least one recessed region and by a growth rate of a growth front of the filling material in a direction perpendicular to the predetermined crystallographic planes exposed.

In certain embodiments, the device of the invention, as described above, comprises multiple recessed regions, each recessed region comprising an embedded nanochannel.

In certain other embodiments, in the device of the invention, as described above, the embedded nanochannels form an array.

In certain aspects, in the device of the invention as described above, the width of the embedded nanochannel is lower or equal than about 1 micron.

In yet further aspects, in the device of the invention as described above the width of the embedded nanochannel is lower or equal than about 10 nm.

In other aspects, in the device of the invention as described above, the filling material comprises a group IV semiconductor or an III-V semiconductor.

In yet further aspects, in the device of the invention as described above, the filling material further comprises oxygen, nitrogen and/or carbon.

The invention also provides a method for manufacturing a nanochannel device comprising:

providing a mono-crystalline substrate comprising at least one recessed region the at least one recessed region having a recess width and exposing predetermined crystallographic planes of the mono-crystalline substrate, and forming an embedded nanochannel in a filling material in the recessed region, further comprising:

forming a filling material in the recessed region by an epitaxial deposition method, whereby a growth rate of a growth front of the filling material in a direction perpendicular to the predetermined crystallographic planes exposed can be controlled such that the embedded nanochannel is formed at an intersection of at least two growth fronts of the filling material.

In certain embodiments, in the method of the invention as described above, a width, a shape, and a depth of the embedded nanochannel is determined by the recess width of the recessed region and the growth rate of the growth front of the filling material in the direction perpendicular to the predetermined crystallographic planes exposed.

In certain other embodiments, in the method of the invention, as described above, no thermal treatment is performed prior to forming the embedded nanochannel.

In various aspects, in the method of the invention as described above, the epitaxial deposition method is suitable to control the growth rates of the growth fronts of the filling material in different directions perpendicular to the exposed crystallographic planes, independently of each other.

In further aspects, in the method of the invention as described above, the epitaxial deposition method is selected from chemical vapor deposition (CVD) and molecular beam epitaxy (MBE).

In yet further embodiments, in the method of the invention as described above, the filling material comprises a group IV semiconductor or an III-V semiconductor.

In other aspects, in the method of the invention as described above, the width of the embedded nanochannel is lower than about 1 micron. In further aspects, in the method of the invention as described above, the width of the embedded nanochannel is lower than about 10 nm.

The invention also provides a method for manufacturing a nanochannel device comprising:

providing a silicon substrate having a (100) orientation and at least one recess, said recess exposing the (110) and (111) crystallographic planes the silicon substrate, and epitaxially growing germanium in the recess, wherein a growth rate of a growth front of germanium in a direction perpendicular to the exposed (110), (100) and, respectively, (111) crystallographic plane exposed are controlled such that an embedded nanochannel with a rectangular shape is formed at an intersection of said growth fronts of germanium.

The present invention provides a nanochannel device comprising an embedded nanochannel or nanopore having a substantially uniform width smaller than (about) 1 micron, preferably smaller than about 10 nm, and a channel or pore length in the microns range or longer.

Furthermore, the present invention provides a nanochannel device comprising an array of nanochannels, said array comprising a regular distribution of nanochannels. Each of the nanochannels in said array in said device having a substantially uniform width smaller than about 1 micron, preferably smaller than about 10 nm.

The present invention also provides a method for manufacturing an embedded nanochannel or array of nanochannels having a substantially uniform width smaller than about 1 micron, preferably smaller than about 10 nm, and a length in the range of microns or longer, using an epitaxial deposition method compatible with the semiconductor manufacturing.

The method of the present invention has the advantage over existing methods in prior art that said fabricated nanochannel device comprises a nanochannel, or array of nanochannels, with controlled nanochannel size, width, and length (i.e., dimensional control at nanometer scale), said width being substantially uniform over the whole length of said nanochannel(s).

It is an advantage of the present invention over existing methods in prior art that the dimensions or size, such as width and length and uniformity of the nanochannel is controlled.

In other words, it is an advantage of the present invention over prior art that the width of the nanochannel(s) is uniform over the whole length of said nanochannel(s).

Furthermore, the method of the invention provides the advantage that a nanochannel device comprising a nanochannel, or array of nanochannels, having a substantially uniform nanochannel width between about 0.5 nm and about 1 micron, more preferably between about 1 nm and about 20 nm, and even more preferably between about 5 nm and about 10 nm, can be manufactured in a reproducible and controllable manner.

The method of the invention can, for example, be used or implemented, or integrated in high throughput and low cost manufacturing, such as ultra-large scale integration semiconductor manufacturing.

The method of the present invention has the advantage over existing methods in prior art that it is a simplified or less complex, low cost, and easy to control, method.

It is an advantage of the method of the invention, compared to methods for forming nanochannels described in the art, that no thermal treatment is performed or required prior to forming the embedded nanochannel.

It is an advantage of the method of the invention, compared to methods for forming nanochannels described in the art, that no chemical-mechanical processing or polishing (CMP) is required and that a CMP step is even avoided.

In one aspect, the invention provided a device comprising a mono-crystalline substrate, the mono-crystalline substrate comprising, at least one recessed region, such as recess or trench, which exposes predetermined crystallographic planes of the mono-crystalline substrate, the at least one recessed region such as recess or trench, further having a recess or trench width and comprising a filling material and an embedded nanochannel or nanopore, wherein the width, the shape, and the depth of the embedded nanochannel or nanopore is determined by the recess or trench width of the at least one recessed region or recess or trench and by the growth rate of the growth front or plane of the filling material in a direction perpendicular to the exposed predetermined crystallographic planes.

In the context of the present invention, a "mono-crystalline substrate" refers to a mono-crystalline semiconductor substrate per se, or a mono-crystalline epitaxial semiconductor layer formed on a suitable, such as mono-crystalline or poly-crystalline semiconductor substrate.

In other aspects of the invention, said semiconductor substrate or said semiconductor layer formed on said semiconductor substrate may be a semiconductor material comprising group IV materials, such as silicon (Si), germanium (Ge), silicon germanium (SiGe), group III-V materials, such as gallium (Ga), Aluminum (Al), gallium arsenide (GaAs), aluminum arsenide (AlAs), or aluminum gallium arsenide (AlGaAs), III-nitride compounds, or any combinations or mixtures thereof.

In the context of the present disclosure, a "recessed region" refers to a recess, or a trench.

In the context of the present disclosure, "an embedded nanochannel or nanopore" is a nanochannel or nanopore which is completely surrounded by the filling material.

In the context of the present disclosure, the "width of a nanochannel" ($w_c$), as illustrated in FIG. 2, refers to the diameter of the nanochannel in case of a circular cross-section. In case the cross-section of the nanochannel has another regular shape, such as diamond-like, a square, a rectangle, a hexagon, or a triangle, the width of a nanochannel refers to the double of the distance from its center, or axis of symmetry, to a point in the periphery, usually the point farthest from the center or axis (outermost radius r). Without wishing to be bound by theory, it is believed that this radius r, equal to the half of the channel width $w_c$, can be expressed by the formula:

$$r = w\left[\frac{1}{2\sin\theta_{111}\cos\theta_{111}} - \frac{GR^{111}}{2GR^{110}\cos\theta_{111}}\right]$$

wherein w is the recess width, $GR^{111}$ and $GR^{110}$ the growth rate of the growth front or plane perpendicular to the (111) and (110) crystallographic plane respectively, and $\theta_{111}$ the angle between the (111) crystallographic plane and the horizontal plane or bottom of the recess region.

The shape of the embedded nanochannel or nanopore in the device according to the disclosure can be diamond-like, round, square, triangle, rectangle, or hexagonal.

In the context of the present disclosure, the "depth of a channel" ($z_c$), as illustrated in FIG. 2, refers to the distance between the bottom of the channel and the bottom of the recess. The depth of the channel depends on the recess width (w) and the ratio between the growth rate $GR^{001}$ of the growth front (or plane) perpendicular to the (100) crystallographic plane or growth rate $GR^{100}$ of the growth front or plane perpendicular to the (100) crystallographic plane and the growth rate $GR^{110}$ of the growth front (or plane) perpendicular to the (110) crystallographic plane, as illustrated by the formula:

$$z_c \approx \frac{w}{2} \frac{GR^{001}}{GR^{110}}$$

Preferably, the device of the invention comprises multiple recessed regions or recesses, or trenches, each recessed region comprising an embedded nanochannel.

More preferably, in the device of the invention, the embedded nanochannels form an array or a network of nanochannels, wherein said array or network of nanochannels comprising a regular distribution of nanochannels.

More particularly, said nanochannels of said array or network are inter-connected or not.

Preferably, in the device according to the invention, the width of the embedded nanochannel is lower than or equal to about 1 micron, preferably lower than or equal to about 10 nm.

More particularly, the width of the embedded nanochannels is comprised between about 0.5 nm and about 1 micron, more preferably between about 1 nm and about 20 nm, and even more preferably between about 5 nm and about 10 nm.

Preferably, in the device of the invention, the length of the embedded nanochannel is about 100 nm or more.

Preferably, in the device of the invention, the width of the embedded nanochannel is substantially uniform over the whole length of said embedded nanochannel.

In the context of the present invention, a "substantially uniform width of the embedded nanochannel over the whole length of said embedded nanochannel" refers to a width of the embedded nanochannel being substantially the same over the whole length of said embedded nanochannel.

Preferably, in the device according to the invention, the embedded nanochannel is horizontal.

In the context of the present invention, a "horizontal or embedded nanochannel" refers to an embedded nanochannel having its longest dimension or length in a horizontal direction (i.e., horizontal or parallel with respect to the bottom plane of the recess region).

In the device according to the invention, the filling material (or the material wherein the nanochannel is embedded) can be any material suitable to be (selectively and conformal) grown epitaxially and (directly) in a pre-defined (or pre-etched) recess (or recessed region, or trench).

Preferably, said filling material is a semiconductor material.

More preferably, in the device of the invention, the filling material is selected from the group consisting of a group IV semiconductor material, such as silicon (Si), germanium (Ge), or silicongermanium (SiGe), a group III-V semiconductor material, such as gallium (Ga), Aluminum (Al), gallium arsenide (GaAs), aluminum arsenide (AlAs), or aluminum gallium arsenide (AlGaAs), or any combinations or mixtures thereof.

More preferably, the filling material further comprises oxygen, nitrogen, and/or carbon.

More particularly, the filling material may be further treated to form oxides, nitrides, or carbides of said filling material.

According to another aspect of the present invention, it is provided a method for manufacturing a nanochannel device comprising the steps of:

providing a mono-crystalline substrate comprising at least one recessed region, the at least one recessed region having a recess width and exposing predetermined crystallographic planes of the mono-crystalline substrate; and epitaxially growing a filling material in the at least one recessed region, wherein the growth rate of the growth front of the filling material in a direction perpendicular to the exposed predetermined crystallographic planes is controlled such that an embedded nanochannel is formed in said at least one recessed region at an intersection of at least two growth fronts of said filling material.

Preferably, in the method of the invention, said at least one recessed region or recess or trench having a recess width and recess depth is formed in said substrate by a patterning process or lithography and etching process.

Preferably, in the method of the invention, the filling material is only or selectively formed directly in or inside the at least one recessed region or recess, or trench.

Preferably, in the method of the invention, no chemical-mechanical processing or chemical-mechanical polishing, or CMP step is performed or in other words, in the method of the disclosure, a CMP step is avoided.

Preferably, in the method of the invention, said growth rate is controlled by introducing chloride during said epitaxial growth.

A suitable amount of chloride for use in a method of the invention depends on the recess width and recess depth of the at least one recessed region or recess, or trench.

Finding a suitable amount of chloride for use in a method of the invention is well within the practice of those skilled in the art.

More preferably, HCl is introduced during said epitaxial growth.

In a method of the invention, the shape of the embedded nanochannel can be modified, such as rounded by a thermal treatment.

More preferably, in the method of the invention, said epitaxial growth is performed at atmospheric pressure, and at a temperature between about 250° C. and about 600° C., more preferably between about 350° C. and about 600° C. for further shaping the nanochannel.

Preferably, in the method of the invention, the width, the shape and the depth of the embedded nanochannel is determined by the recess width of the at least one recessed region and by the growth rate of the growth front of the filling material in the direction perpendicular to the exposed predetermined crystallographic planes.

Preferably, in the method of the invention, no thermal treatment is performed prior to the step of forming the embedded nanochannel.

Preferably, in the method of the invention, the epitaxial growth of the filling material is suitable to control the growth rates of the growth fronts of the filling material in different directions perpendicular to the exposed crystallographic planes, independently of each other.

More particularly, the epitaxial growth of the filling material is performed by chemical vapor deposition (CVD), or molecular beam epitaxy (MBE).

In the method of the invention, the filling material or the material wherein the nanochannel is embedded can be any material suitable to be selectively and conformal grown epitaxially and directly in a pre-defined or pre-etched recess or recessed region, or trench.

Preferably, said filling material is a semiconductor material.

More preferably, in the method of the invention, the filling material is selected from the group consisting of a group IV semiconductor material, such as silicon (Si), germanium (Ge), or silicongermanium (SiGe), a group III-V semiconductor material, such as gallium (Ga), Aluminum (Al), gallium arsenide (GaAs), aluminum arsenide (AlAs), or aluminum gallium arsenide (AlGaAs), or any combinations or mixtures thereof.

More preferably, the filling material further comprises oxygen, nitrogen, and/or carbon.

More particularly, the filling material may be further treated to form oxides, nitrides, or carbides of said filling material.

Preferably, in the method of the invention, the width of the embedded nanochannel is lower than or equal to about 1 micron, preferably lower than or equal to about 10 nm.

More particularly, the width of the embedded nanochannels is comprised between about 0.5 nm and about 1 micron, more preferably between about 1 nm and about 20 nm, and even more preferably between about 5 nm and about 10 nm.

Advantageously, the width of the embedded nanochannel is substantially uniform over the whole length of said embedded nanochannel.

More preferably, the embedded nanochannel is horizontal.

According to a preferred method of the invention, the mono-crystalline substrate is a silicon substrate having a (100) orientation and at least one recessed region, said recessed region exposing the (100), (110), and (111) crystallographic planes of the silicon substrate, wherein the filling material is germanium and wherein the growth rate of the growth front of germanium in a direction perpendicular to the exposed (110), (100), and (111) crystallographic plane is controlled such that an embedded nanochannel is formed in said at least one recessed region at an intersection of said growth fronts of germanium.

More preferably, said growth rate is controlled by introducing chloride during said epitaxial growth.

Even more preferably, HCl is introduced during said epitaxial growth.

More preferably, chloride is introduced during the epitaxial growth for reducing the growth rate of the growth front of germanium in a direction perpendicular to the exposed (100) crystallographic plane more than the growth rate of the growth front of germanium in a direction perpendicular to the exposed (110) crystallographic plane, thereby forming (111) facets before two opposite (110) crystallographic planes merge.

In the context of the present invention, two opposite (110) crystallographic planes refer to two (110) crystallographic planes being opposite with respect to the z-axis or being on opposite sides of the z-axis corresponding to −x and +x, or facing each other, as depicted in FIG. 2.

Even more preferably, the formation of (111) facets maintain the uniformity of pore diameter or width along the whole length of the nanochannel.

More preferably, said epitaxial growth is performed at atmospheric pressure, and at a temperature between about 250° C. and about 600° C., more preferably between about 350° C. and about 600° C. for further shaping the nanochannel, thereby forming an embedded nanochannel with a rectangular shape in said at least one recessed region at an intersection of said growth fronts of germanium.

According to still another aspect, the device of the invention is obtainable by a method according to the disclosure.

Preferably, the width of the embedded nanochannel in said device is lower than or equal to about 1 micron, preferably lower than or equal to about 10 nm, and the length of the embedded nanochannel is about 100 nm or more.

More preferably, the width of the embedded nanochannel in said device is substantially uniform over the whole length of said embedded nanochannel.

More preferably, the embedded nanochannel in said device is horizontal.

In still another aspect, the device of the invention comprises a mono-crystalline substrate, the mono-crystalline substrate having at least one recessed region which exposes predetermined crystallographic planes of the mono-crystalline substrate, the at least one recessed region further having a recess width and comprising a filling material and an embedded nanochannel, wherein the width of the embedded nanochannel is lower than or equal to about 1 micron, preferably lower than or equal to about 10 nm, and wherein the length of the embedded nanochannel is about 100 nm or more.

According to yet another aspect, the invention relates to the use of the device according to the invention for the manufacturing of a biosensor, or a biochip.

More particularly, the device of the invention can be part of or integrated with bio-microelectromechanical systems (bioMEMS), biochips, biosensors, or micro fluidic devices.

The nanochannels of the device of the present disclosure can be used or are suitable for single molecule or DNA separation and/or detection with nanochannel widths of less than about 10 nm.

BRIEF DESCRIPTION OF THE DRAWINGS

All drawings are intended to illustrate some aspects and embodiments of the present disclosure. The drawings described are only schematic and are non-limiting.

FIG. 1 shows a Transmission Electron Microscopy (TEM) picture of a nanochannel (A) with a width less than 10 nm; (B) in the Y-Y direction, as depicted in (A) showing a channel length of more than 100 nm.

DETAILED DESCRIPTION OF THE INVENTION

Figure 2:
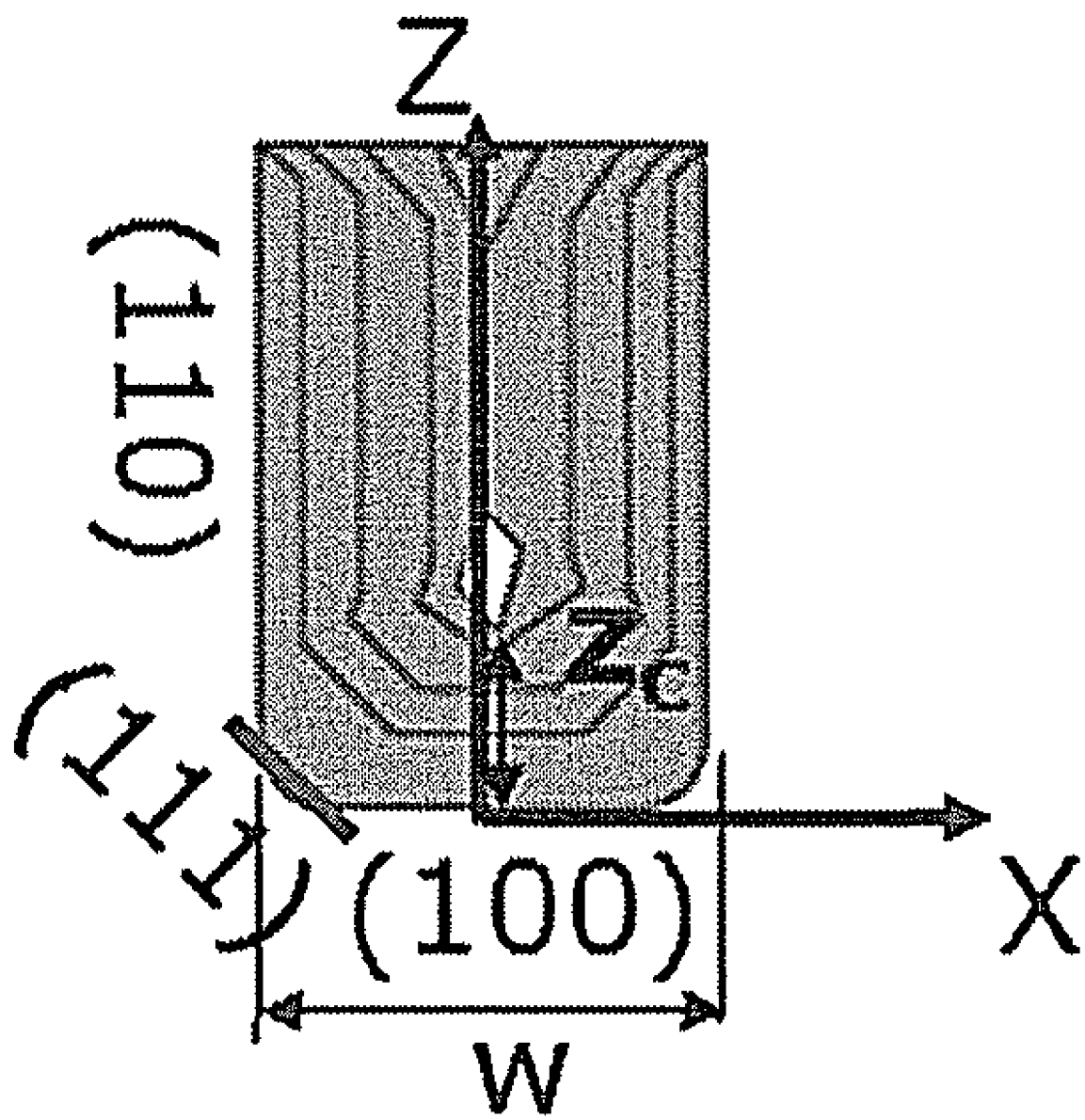
FIG. 2 shows schematically the evolution of the epitaxial growth and the forming of the nanochannel.

An aim of the present invention is to provide a nanochannel device comprising an embedded nanochannel or nanopore having a channel or pore width smaller than 1 micron and a channel or pore length in the microns range or longer.

Preferably the width/diameter of the nanochannel is substantially uniform over the whole length.

More preferably the width/diameter is smaller than 10 nm.

Another aim is to provide a nanochannel device comprising an array of nanochannels comprising a regular distribution of nanochannels, each of the nanochannels having a diameter smaller than 1 micron, more preferably smaller than 10 nm and a good or high uniformity over the whole length when compared to devices in the art.

Yet another aim is to provide a method to manufacture a nanochannel device comprising an embedded nanochannel or array of nanochannels having diameter smaller than 1 micron, more preferably smaller than 10 nm and a length in the range of microns or longer using an epitaxial deposition method compatible with the semiconductor manufacturing.

Preferably the method has higher throughput and/or lower costs compared with the state in the art methods.

In one aspect of the present invention a device is disclosed, comprising a mono-crystalline substrate, the monocrystalline substrate having at least one recessed region which exposes predetermined crystallographic planes of the mono-crystalline substrate, the at least one recessed region further having a recess width and comprising a filling material and an embedded nanochannel a nanochannel which is completely surrounded by the filling material, wherein a width and a shape of the embedded nanochannel is determined by the recess width of the at least one recessed region and by a growth rate of a growth front of the filling material in a direction perpendicular to the predetermined crystallographic planes exposed.

It is an advantage of the disclosed device to have an adjustable nanochannel width and nanochannel length.

Alternatively or additionally a good or high uniformity in nanochannel width/diameter is obtained over the whole length when compared to devices in the art.

In embodiments of the invention, the device comprises multiple recessed regions, each recessed region comprising a nanochannel.

Further, in different embodiments of the invention the nanochannels form an array or a network of nanochannels which can be inter-connected or not.

The width of the nanochannel is substantially uniform over the whole length and lower or equal than 1 micron.

An embedded nanochannel with a uniform width lower or equal than 10 nm is another advantage of the invention.

Nanochannels having a width diameter between 1 micron and 0.5 nm, more preferably between 1 nm and 20 nm and even more preferably between 5 nm and 10 nm can be manufactured in a reproducible and controllable manner.

In various embodiments of the invention, the filling material or the material wherein the nanochannel is embedded can be any material suitable to be grown epitaxial and in a pre-defined recess.

Preferably the filling material is a semiconductor material, more preferably a group IV semiconductor or an III-V semiconductor.

According to further embodiments of the disclosure the filling material can further comprise oxygen, nitrogen, carbon.

In a second aspect a method for manufacturing a nanochannel device is disclosed, comprising:

providing a mono-crystalline substrate comprising (or consisting of) at least one recessed region the at least one recessed region having a recess width and exposing predetermined crystallographic planes of the mono-crystalline substrate, and forming an embedded nanochannel in a filling material in the recessed region, further comprising forming a filling material in the recessed region by an epitaxial deposition method, whereby a growth rate of a growth front of the filling material in a direction perpendicular to the predetermined crystallographic planes exposed can be controlled such that the embedded nanochannel is formed at an intersection of at least two growth fronts of the filling material.

Throughout the disclosure, by an embedded nanochannel is understood a nanochannel completely surrounded by a filling material.

Different embodiments further disclose that a width and a shape of the nanochannel is determined by the recess width of the recessed region and the growth rate of the growth front of the filling material in the direction perpendicular to the predetermined crystallographic planes exposed.

The depth of the channel ($z_c$) as illustrated in FIG. 2 is defined as the distance between the bottom of the channel and the bottom of the recess and depends on the recess width (w) and the ratio between the growth rate $GR^{001}$ of the growth front (or plane) perpendicular to the (110) crystallographic plane and the growth rate ($GR^{110}$) of the growth front (or plane) perpendicular to the (110) crystallographic plane, as illustrated by formula below.

$$z_c \approx \frac{w}{2} \frac{GR^{001}}{GR^{110}}$$

Throughout the disclosure, the width of the nanochannel ($w_c$), as illustrated in FIG. 2, is to be understood as the diameter of the nanochannel in case of a circular cross-section. In case the cross-section of the nanochannel has another regular shape, such as diamond-like, a square, a rectangle, a hexagon, a triangle, the width of the nanochannel refers to the double of the distance from its center, or axis of symmetry, to a point in the periphery, usually the point farthest from the center or axis (outermost radius r). Without willing to be bound by theory, this radius r, equal to the half of the channel width $w_c$, can be expressed by the following formula:

$$r = w \left[ \frac{1}{2\sin\theta_{111}\cos\theta_{111}} - \frac{GR^{111}}{2GR^{110}\cos\theta_{111}} \right]$$

wherein w is the recess width, $GR^{111}$ and $GR^{110}$ the growth rate of the growth front perpendicular to the (111) and respectively (110) crystallographic plane, and $\theta_{111}$ the angle between the (111) crystallographic plane and the horizontal plane (bottom of the recess region).

It is an advantage of the method that no thermal treatment is performed or required prior to forming the embedded nanochannel.

The epitaxial deposition method is suitable to control the growth rates of the growth fronts of the filling material in different directions perpendicular to the exposed crystallographic planes, independently of each other.

In specific embodiments of the second aspect, the epitaxial deposition method is selected from chemical vapor deposition (CVD) and molecular beam epitaxy (MBE).

In certain embodiment of the invention a method for manufacturing a nanochannel device is disclosed, comprising:

providing a silicon substrate having a (100) orientation and at least one recess, said recess exposing the (11) and (111) crystallographic planes the silicon substrate; and epitaxially growing germanium in the recess, wherein a growth rate of a growth front of germanium in a direction perpendicular to the exposed (110), (100) and, respectively, (111) crystallographic plane exposed are controlled such that a nanochannel with a rectangular shape is formed at an intersection of said growth fronts of germanium.

The growth rates of the growth fronts of germanium in a direction perpendicular to the exposed (110), (100) and (111) crystallographic planes are controlled by supplying a controlled amount of precursor, such as $GeH_4$, $Ge_2H_6$, $Ge_3H_8$ and HCl at certain temperature and pressure conditions.

In the context of the present invention, the term "precursor" refers to molecules used for forming or depositing the semiconductor filling material in or inside)the at least one recessed region or recess or trench.

A suitable precursor for use in a method of the invention depends on the filling material to be deposited in or inside the at least one recessed region or recess or trench.

Examples of precursors suitable for use in a method of the invention are silicon precursors, such as silane, disilane, trisilane, or any other high order silicon precursors); germanium precursors, such as germane, digermane, trigermane, or any other high order germanium precursors; binary silicon-germanium precursors, known as germyl-silanes ($H_3GeSiH_3$, $(GeH_3)_2SiH_2$, $(H_3Ge)_3SiH$, $(H_3Ge)_4Si$); chlorinated precursors of the group IV-semiconductor materials; or any combinations or mixtures thereof.

Finding a suitable precursor and a suitable amount of precursor for use in the method of the disclosure will be apparent to those skilled in the art.

A suitable amount of chloride for use in a method according to the disclosure depends on the recess width and recess depth of the at least one recessed region or recess or trench.

In a method of the disclosure, a flow of chloride, such as HCl, or $Cl_2$, is chosen to have a balance between the growth rates on all exposed predetermined crystallographic planes of the at least one recessed region or on all semiconductor surfaces enabling the formation of the nanochannels of the disclosure, said nanochannels having a radius r as expressed by the formula as described above. However, the flow of chloride, such as HCl, or $Cl_2$ has to be sufficiently low in order to avoid that the etching performed by the flow of said chloride exceeds the germanium deposition performed by the flow of the precursor. It is expected that the optimal flow of chloride, such as HCl, or $Cl_2$ varies with the temperature and the gas-flow of the precursor.

Finding a suitable amount of chloride for use in a method of the invention is well within the practice of those skilled in the art.

In a specific example, a silicon substrate is provided having a (100) orientation and at least one trench, said trench exposing the (100), (110), and (111) crystallographic planes of the silicon substrate. The width of said trench is 50 nm, the depth of said trench is 100 nm. 500 sccm $GeH_4$ in 30 slm $H_2$ carrier gas and 15 sccm HCl is supplied in a CVD reactor at 450° C. and atmospheric pressure in the CVD reactor. Epitaxial growth on the side walls alone would result in complete filling of the trench, without forming a nanopore or nanochannel. The fact that epitaxial growth occurs on the bottom and on the side walls, together with the fact that the growth at the side walls is not completely uniform from top-to-bottom, results in the formation of an embedded nanochannel, said nanochannel having a channel depth ($z_c$) of 50 nm and a channel width ($w_c$) of 10 nm.

In the present disclosure, a nanochannel fabrication method is described. By using selective growth of Si, SiGe, or Ge in pre-etched Si trenches, under optimized growth conditions as discussed above, embedded (horizontal) nanochannels having a width of about 10 nm, 5 nm, or smaller can be obtained in the selectively grown epitaxial materials. Also arrays of nanochannels having substantially the same width or diameter can be manufactured because of the (111) facet formation. Growth conditions can be tuned to obtain smaller or larger diameters.

Figure 3:
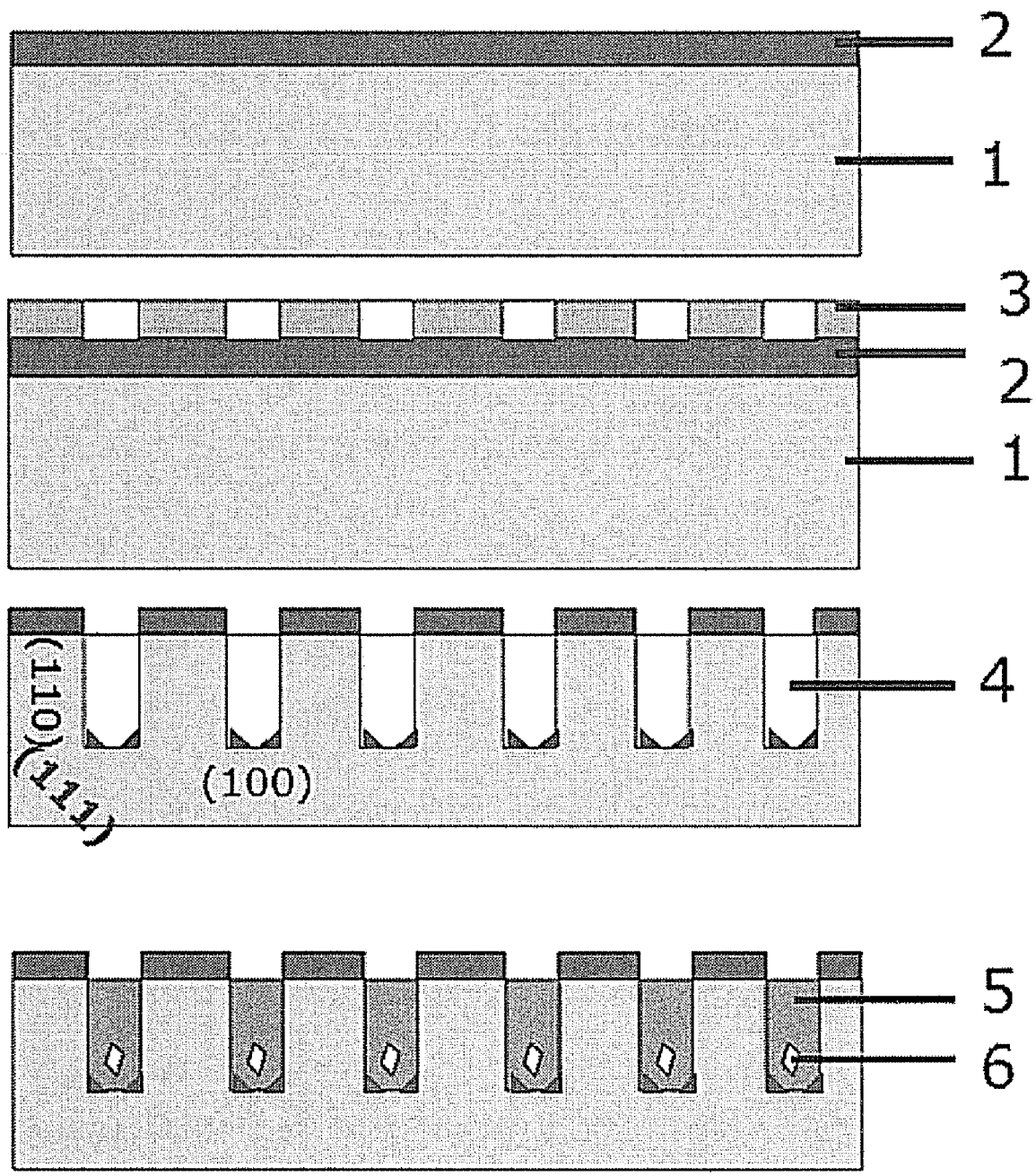
FIG. 3 shows schematically the manufacturing flow according to an embodiment of the disclosure.

A manufacturing flow according to an embodiment of the method of the disclosure is schematically represented in FIG. 3.

In a first step a hardmask (2) is deposited on a substrate (1). Next, a photoresist (3) is patterned on the hardmask (2) and then, in the following step, trenches (or recessed regions) (4) are etched in the substrate (1) by, for example, dry-etch. In the following step a filling material (5) is epitaxially grown in the trenches (4) according to the method of the disclosure such that at the intersection of the growth fronts a nanochannel (6) is formed.

The formation of nanochannel is realized by controlling the growth rates of the growth fronts in a direction perpendicular to the (110) plane and, respectively the bottom (100) plane. By introducing chloride during the epitaxial growth, the {100} growth rate is reduced more than that of the (110) growth rate. The (111) facets being a first pair of facets are formed during growth as shown in FIG. 2 and since the (110) planes grow fast (or grow faster compared to the (100) growth rate, another pair of (111) facets is formed before the two opposite (110) planes merge. After the two opposite (110) planes merge, a horizontal pore or channel is left in the material. By horizontal pore or channel one understands a channel having its longest dimension or length in a horizontal direction.

The (111) facets formation is controlled by introducing chloride during epitaxial growth and by using appropriate growth conditions. The formation of (111) facets maintains the uniformity of pore diameter or width along the whole length of the nanochannel.

The epitaxial growth in the trench or recessed region prevents the formation of seam along the trench and embedded nanochannels are formed, as shown by the cross-section TEM shown in FIGS. 1A and 1B.

The length of the embedded nanochannels is determined by the trench/recess region length which can be extended to microns or millimeters if needed.

Advantageously, the initial shape of the nanochannel can be modified, for example rounded, by a thermal treatment.

In different embodiments of the first and the second aspect of the disclosure, the mono-crystalline substrate can be a group IV-semiconductor material, a III-V compound or a III-nitride compound. Preferably, the group IV-semiconductor material can be silicon or germanium or combinations thereof.

The method of the invention can be implemented in a high throughput and low cost manufacturing such as the ultra-large scale integration semiconductor manufacturing.

Another advantage of the different embodiments of the present invention is the adjustable pore length with pore lengths in the range of hundred nm up to millimeters.

The nanochannels of the disclosure can be part of or integrated with a biochip, biosensor or a micro fluidic device.

A diameter/channel width of 1 micron or smaller is obtainable with the method of the disclosure.

Furthermore, a diameter or channel width of 5 nm or smaller obtainable with the method of the disclosure, which make the nanochannels suitable for DNA separation and/or detection.

Advantageously, the surface properties of the pore/nanochannels can be adjusted to suit different applications.

With epitaxial growth, different materials such as Si, SiGe, Ge materials can be integrated to tailor the nanochannel surface properties upon the specific needs of different applications.

For instance, the Si channel can be oxidized to form $SiO_2$ surrounded nanochannels.

The method of the disclosure comprising forming a filling material by a deposition technique able to deposit or form a conformal layer-by-layer film on each of the different crystallographic planes exposed. A typical example of such a deposition technique is the epitaxial growth.

The nanochannel formation is determined by the crystallographic planes exposed in the recess and the epitaxy process conditions. The recess is formed or patterned by lithography and etching, such as dry or wet-etching to have different size, profile exposed crystallographic planes and/or surface condition.

Advantageously, the regular nanochannels/nanopores are formed by epitaxial growth directly in the recess, therefore no further annealing and/or chemical-mechanical processing (CMP) are needed.

Advantageously, the filling material is grown selectively only in the recess or trench, thereby avoiding any further CMP process.

The growth rate of the growth front of the filling material in different directions, perpendicular to the crystallographic planes exposed is controlled by the amount of precursor and chlorine or chloride, such as HCl, or $Cl_2$, supplied as well as by the temperature and the pressure conditions of the deposition.

The shape of the nanochannel formed at the intersection of the growth fronts or planes can be any of the diamond-like, round, square, triangle or rectangle, or hexagonal. Round shape can be obtained by tuning the recess profile or design, growth conditions and/or reflow or post-treatment process conditions.

What is claimed is:

1. A device comprising a mono-crystalline substrate, the mono-crystalline substrate having multiple recessed regions, wherein each recessed region exposes predetermined crystallographic planes of the mono-crystalline substrate, wherein each recessed region further having a recess width and comprising a filling material and an embedded nanochannel,
   wherein the width, the shape, and the depth of the embedded nanochannel is determined by the recess width of the at least one recessed region and by the growth rate of the growth front of the filling material in a direction perpendicular to the exposed predetermined crystallographic planes,
   wherein the width of the embedded nanochannel is lower than or equal to 10 nm,
   wherein the mono-crystalline substrate is a silicon substrate and the filling material is germanium.

2. The device according to claim 1, wherein the embedded nanochannels form an array or a network of nanochannels.

3. A method for manufacturing a nanochannel device comprising:
   providing a mono-crystalline substrate comprising at least one recessed region, the at least one recessed region having a recess width and exposing predetermined crystallographic planes of the mono-crystalline substrate; and
   epitaxially growing a filling material in the at least one recessed region,
   wherein the growth rate of the growth front of the filling material in a direction perpendicular to the exposed predetermined crystallographic planes is controlled such that an embedded nanochannel is formed in said at least one recessed region at an intersection of at least two growth fronts of said filling material,
   wherein the width of the embedded nanochannel is lower than or equal to 10 nm.

4. The method according to claim 3, wherein said growth rate is controlled by introducing chloride during said epitaxial growth.

5. The method according to claim 3, wherein the width, the shape and the depth of the embedded nanochannel is determined by the recess width of the at least one recessed region and by the growth rate of the growth front of the filling material in the direction perpendicular to the exposed predetermined crystallographic planes.

6. The method according to claim 3, wherein no thermal treatment is performed prior to forming the embedded nanochannel, wherein the thermal treatment is a hot chemical reaction.

7. The method according to claim 3, wherein the epitaxial growth of the filling material is suitable to control the growth rates of the growth fronts of the filling material in different directions perpendicular to the exposed crystallographic planes, independently of each other.

8. The device obtainable by the method according to claim 3.

9. A method for manufacturing a nanochannel device comprising:
   providing a mono-crystalline substrate comprising at least one recessed region, the at least one recessed region having a recess width and exposing predetermined crystallographic planes of the mono-crystalline substrate; and
   epitaxially growing a filling material in the at least one recessed region, wherein the growth rate of the growth front of the filling material in a direction perpendicular to the exposed predetermined crystallographic planes is controlled such that an embedded nanochannel is formed in said at least one recessed region at an intersection of at least two growth fronts of said filling material,
   wherein the width of the embedded nanochannel is lower than or equal to 10 nm,
   wherein the mono-crystalline substrate is a silicon substrate having a (100) orientation and at least one recessed region, said recessed region exposing the (100), (110), and (111) crystallographic planes of the silicon substrate, wherein the filling material is germanium and wherein the growth rate of the growth front of germanium in a direction perpendicular to the exposed (110), (100), and (111) crystallographic plane is controlled such that an embedded nanochannel is formed in said at least one recessed region at an intersection of said growth fronts of germanium.

10. A method for manufacturing a nanochannel device comprising:
    providing a mono-crystalline substrate comprising at least one recessed region, the at least one recessed region having a recess width and exposing predetermined crystallographic planes of the mono-crystalline substrate; and
    epitaxially growing a filling material in the at least one recessed region, wherein the growth rate of the growth front of the filling material in a direction perpendicular to the exposed predetermined crystallographic planes is controlled such that an embedded nanochannel is formed in said at least one recessed region at an intersection of at least two growth fronts of said filling material,
    wherein the width of the embedded nanochannel is lower than or equal to 10 nm,
    wherein the mono-crystalline substrate is a silicon substrate having a (100) orientation and at least one recessed region, said recessed region exposing the (100), (110), and (111) crystallographic planes of the silicon substrate, wherein the filling material is germanium and wherein the growth rate of the growth front of germanium in a direction perpendicular to the exposed (110), (100), and (111) crystallographic plane is controlled such that an embedded nanochannel is formed in said at least one recessed region at an intersection of said growth fronts of germanium, wherein chloride is introduced during the epitaxial growth for reducing the growth rate of the growth front of germanium in a direction perpendicular to the exposed (100) crystallographic plane more than the growth rate of the growth front of germanium in a direction perpendicular to the exposed (110) crystallographic plane, thereby forming (111) facets before two (110) crystallographic planes merge.

11. A method for manufacturing a nanochannel device comprising:

providing a mono-crystalline substrate comprising at least one recessed region, the at least one recessed region having a recess width and exposing predetermined crystallographic planes of the mono-crystalline substrate; and epitaxially growing a filling material in the at least one recessed region, wherein the growth rate of the growth front of the filling material in a direction perpendicular to the exposed predetermined crystallographic planes is controlled such that an embedded nanochannel is formed in said at least one recessed region at an intersection of at least two growth fronts of said filling material, wherein the width of the embedded nanochannel is lower than or equal to 10 nm, wherein the mono-crystalline substrate is a silicon substrate having a (100) orientation and at least one recessed region, said recessed region exposing the (100), (110), and (111) crystallographic planes of the silicon substrate, wherein the filling material is germanium and wherein the growth rate of the growth front of germanium in a direction perpendicular to the exposed (110), (100), and (111) crystallographic plane is controlled such that an embedded nanochannel is formed in said at least one recessed region at an intersection of said growth fronts of germanium, wherein chloride is introduced during the epitaxial growth for reducing the growth rate of the growth front of germanium in a direction perpendicular to the exposed (100) crystallographic plane more than the growth rate of the growth front of germanium in a direction perpendicular to the exposed (110) crystallographic plane, thereby forming (111) facets before two (110) crystallographic planes merge, wherein the formation of (111) facets maintain the uniformity of pore diameter or width along the whole length of the nanochannel.

* * * * *